United States Patent [19]

Hanson

[11] 4,342,026
[45] Jul. 27, 1982

[54] NUMBER CONVERSION APPARATUS

[75] Inventor: Lawrence G. Hanson, Temple City, Calif.

[73] Assignee: Burroughs Corporation, Detroit, Mich.

[21] Appl. No.: 156,201

[22] Filed: Jun. 3, 1980

[51] Int. Cl.³ ............................................... G06F 5/02
[52] U.S. Cl. ............................... 340/347 DD; 235/311
[58] Field of Search ................ 340/347 DD; 235/310, 235/311

[56] References Cited

U.S. PATENT DOCUMENTS

| | | | |
|---|---|---|---|
| 2,814,437 | 11/1957 | Woodbury | 340/347 DD |
| 2,860,831 | 11/1958 | Hobbs | 340/347 DD |
| 2,894,686 | 7/1959 | Holmes | 340/347 DD |
| 2,929,556 | 3/1960 | Hawkins | 340/347 DD |
| 3,257,547 | 7/1966 | Bernstein | 340/347 DD |
| 3,505,675 | 4/1970 | Holtey | 340/347 DD |

FOREIGN PATENT DOCUMENTS

| | | | |
|---|---|---|---|
| 1138559 | 1/1969 | United Kingdom | 340/347 DD |
| 1257075 | 12/1971 | United Kingdom | 340/347 DD |

*Primary Examiner*—Charles D. Miller
*Attorney, Agent, or Firm*—Nathan Cass; Kevin R. Peterson; David G. Rasmussen

[57] ABSTRACT

An apparatus for converting an input BCD number into its equivalent output binary number in a first mode of operation or an input binary number into its equivalent output BCD number in a second mode of operation. Each input or output number comprises at least one two-digit character. An addressable storage circuit selectively stores the characters of the input number, as well as subsequent interim characters from a combining circuit, in predetermined storage locations. A developing circuit is selectively responsive to each character read out from a storage location and to an associated lower digit of each delayed odd character from a delay circuit for developing an odd addend and an odd multiplier, which are utilized by a first conversion circuit to develop an odd character. The odd character is delayed by the delay circuit to produce the delayed odd character. A second conversion circuit utilizes an even multiplier from an output circuit and the upper digit of the delayed odd character as an even addend to develop an even character. A combining circuit selectively combines consecutive pairs of the upper digits of the even characters into interim characters which are selectively stored in the predetermined storage locations of the addressable storage circuit. The output circuit is selectively responsive to associated lower digits of the even and delayed odd characters for developing even multipliers and the converted output number.

9 Claims, 13 Drawing Figures

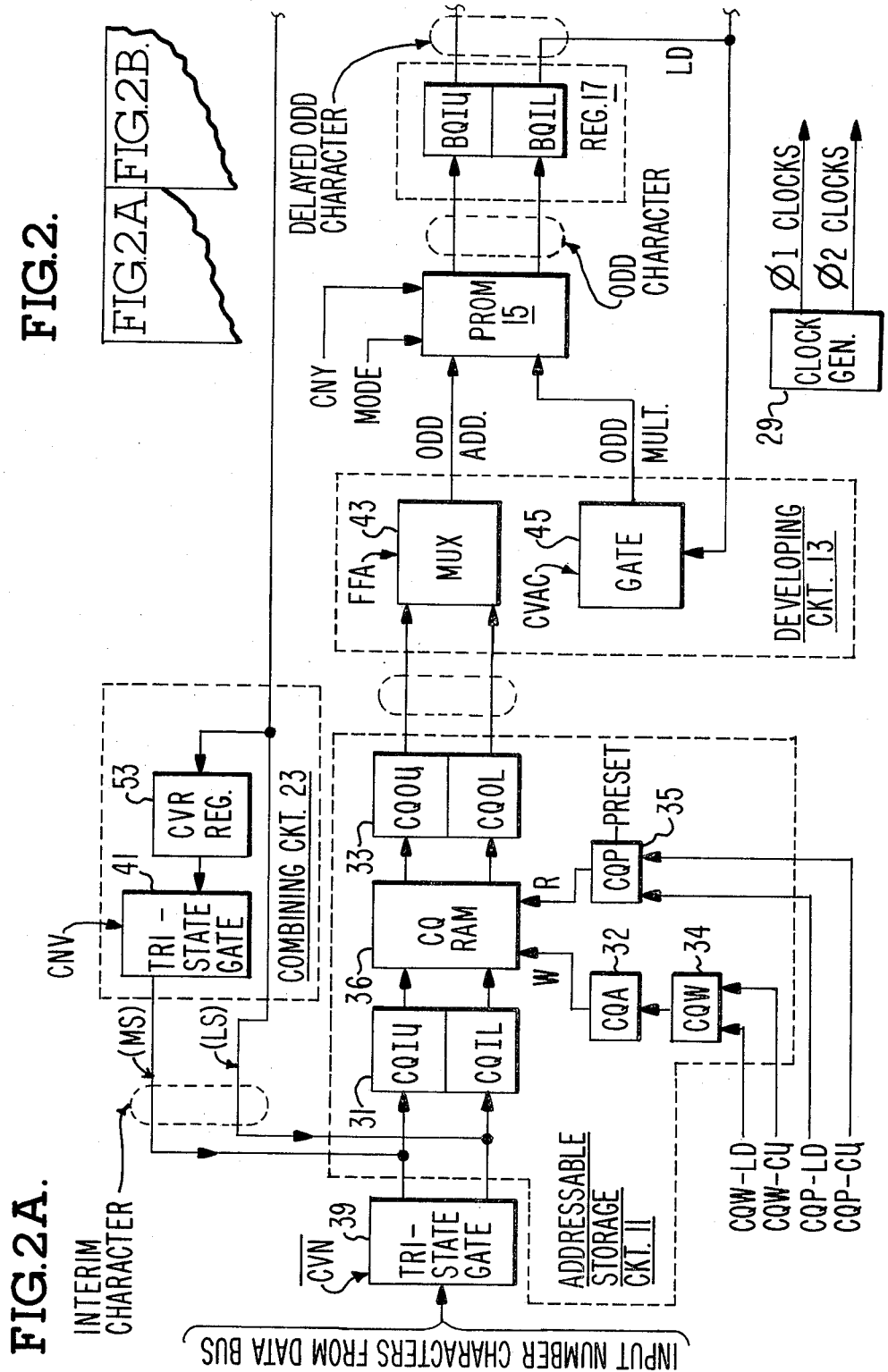

FIG.6.

| | $P_0$ | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ |
|---|---|---|---|---|---|---|---|---|---|---|---|---|---|---|---|---|
| AQW 56 | 00 | 00 | 00 | FF | FF | FF | FF | FE | FE | FE | FE | FD | FD | FD | FD | FD |
| AQA 55 | 00 | 00 | 00 | FF | FF | FF | FE | FE | FE | FE | FE | FD | FD | FD | FD | FD |
| AQP 57 | FD | FD | FD | FD | FD | FD | FD | FD | FD | FD | FD | FD | FD | FD | FD | FD |
| BQW 71 | 00 | 00 | 00 | 00 | 00 | 00 | 00 | 00 | 00 | 00 | 00 | 00 | 00 | 00 | 00 | 00 |
| BQP 73 | FF | FF | FF | FF | FF | FF | FF | FF | FF | 00 | 00 | 00 | 00 | 00 | 00 | 00 |
| CQW 34 | 01 | 01 | 01 | FF | FF | FF | FF | FF | 00 | 00 | 00 | 00 | 00 | 00 | 00 | 00 |
| CQA 32 | 01 | 01 | 01 | 01 | FF | FF | FF | 00 | 00 | 00 | 00 | 00 | 00 | 00 | 00 | 00 |
| CQP 35 | FF | FF | FF | 00 | 00 | 00 | 00 | 00 | 00 | 00 | 00 | 00 | 00 | 00 | 00 | FF |

←———— CNV PERIOD ————→

FIG.7A.
BCD-TO BINARY CHART

FIG.7.

| FIG.7A. | FIG.7B. |

| PERIOD | GATE 45 INPUT | PROM 15 | | | | DELAY REG. 17 | | INPUT GATE 51 | PROM 19 | | | |
|---|---|---|---|---|---|---|---|---|---|---|---|---|
| | | INPUT | | OUTPUT | | | | | INPUT | | OUTPUT | |
| | | ODD MULT. | ODD ADD. | UD | LD | BQIU | BQIL | | EVEN MULT. | EVEN ADD. | UD | LD |
| P₀ | X | X | X | X | X | X | X | X | X | X | X | X |
| P₁ | X | X | X | X | X | X | X | X | X | X | X | X |
| P₂ | X | 0 | 0 | 0 | 0 | X | X | X | X | X | X | X |
| P₃ | 0 | 0 | 4 | 0 | 4 | 0 | 0 | X | 0 | 0 | 0 | 0 |
| P₄ | 4 | 4 | 7 | 2 | F | 0 | 4 | 0 | 0 | 0 | 0 | 0 |
| P₅ | F | F | 3 | 9 | 9 | 2 | F | 0 | 0 | 2 | 0 | 2 |
| P₆ | 9 | 0 | 0 | 0 | 0 | 9 | 9 | 2 | 2 | 9 | 1 | 0 |
| P₇ | 0 | 0 | 0 | 0 | 0 | 0 | 0 | 0 | 0 | 0 | 0 | 0 |
| P₈ | 0 | 0 | 0 | 0 | 0 | 0 | 0 | 0 | 0 | 0 | 0 | 0 |
| P₉ | 0 | 0 | 1 | 0 | 1 | 0 | 0 | 0 | 0 | 0 | 0 | 0 |
| P₁₀ | 1 | 0 | 0 | 0 | 0 | 0 | 1 | 0 | 0 | 0 | 0 | 0 |
| P₁₁ | 0 | 0 | 0 | 0 | 0 | 0 | 0 | 0 | 0 | 0 | 0 | 0 |
| P₁₂ | 0 | 0 | 0 | 0 | 0 | 0 | 0 | 0 | 0 | 0 | 0 | 0 |
| P₁₃ | X | X | X | X | X | X | X | X | X | X | X | X |

CNV (spans P₁ through P₁₂)

FIG.7B.

BCD TO BINARY CHART

| CQI 31 | | CQ RAM 36 | | | CQO 33 | | MUX 43 | CVR REG. 53 | AQI 49 | | AQ RAM 59 | |
|---|---|---|---|---|---|---|---|---|---|---|---|---|
| CQIU | CQIL | W INPUT | ADDR. | R OUTPUT | CQOU | CQOL | OUTPUT | OUTPUT | AQIU | AQIL | W INPUT | ADDR. |
| X | X | XX | 01/FF | 04 | X | X | X | X | X | X | XX | 00 |
| X | X | XX | 01/FF | 04 | X | X | X | X | X | X | XX | 00 |
| X | X | XX | 01/FF | 04 | 0 | 4 | 0 | X | X | X | XX | 00 |
| X | X | XX | 01/FF | 73 | 0 | 4 | 4 | X | X | X | XX | 00 |
| X | 0 | X0 | FF/00 | 73 | 7 | 3 | 7 | 0 | 0 | 0 | 00 | FF |
| 0 | 0 | 00 | FF/FF | 00 | 7 | 3 | 3 | 0 | 0 | 4 | 04 | FF |
| 0 | 0 | 00 | 00/FF | 00 | 0 | 0 | 0 | 0 | 2 | F | 2F | FF |
| 0 | 1 | 01 | 00/00 | 01 | 0 | 0 | 0 | 1 | 0 | 9 | 09 | FF |
| 1 | 0 | 10 | FF/00 | 01 | 0 | 1 | 0 | 0 | 0 | 0 | 00 | FE |
| 0 | 0 | 00 | FF/FF | 00 | 0 | 1 | 1 | 0 | 0 | 0 | 00 | FE |
| 0 | 0 | 00 | 00/FF | 00 | 0 | 0 | 0 | 0 | 0 | 0 | 00 | FE |
| 0 | 0 | 00 | 00/00 | 00 | 0 | 0 | 0 | 0 | 0 | 1 | 01 | FE |
| 0 | 0 | 00 | FF/00 | 00 | 0 | 0 | 0 | 0 | 0 | 0 | 00 | FD |
| X | X | XX | FF/FF | XX | X | X | X | X | X | X | XX | FD |

FIG. 8A. BINARY-TO-B C D-CHART

| PERIOD | GATE 45 INPUT | PROM 15 | | | | DELAY REG. 17 | | INPUT GATE 51 | PROM 19 | | | |
|---|---|---|---|---|---|---|---|---|---|---|---|---|
| | | INPUT | | OUTPUT | | | | | INPUT | | OUTPUT | |
| | | ODD MULT. | ODD ADD. | YD | LD | BQIU | BQIL | | EVEN MULT. | EVEN ADD. | YD | LD |
| P0 | X | X | X | X | X | X | X | X | X | X | X | X |
| P1 | X | X | X | X | X | X | X | X | X | X | X | X |
| P2 | X | 0 | 0 | 0 | 0 | X | X | X | X | X | X | X |
| P3 | 0 | 0 | 1 | 0 | 1 | 0 | 0 | X | 0 | 0 | 0 | 0 |
| P4 | 1 | 1 | 0 | 2 | 9 | 0 | 1 | 0 | 0 | 0 | 0 | 0 |
| P5 | 9 | 9 | 9 | F | 3 | 2 | 9 | 0 | 0 | 2 | 0 | 2 |
| P6 | 3 | 0 | 0 | 0 | 0 | F | 3 | 2 | 2 | F | 4 | 7 |
| P7 | 0 | 0 | 0 | 0 | 0 | 0 | 0 | 7 | 0 | 0 | 0 | 0 |
| P8 | 0 | 0 | 0 | 0 | 0 | 0 | 0 | 0 | 0 | 0 | 0 | 0 |
| P9 | 0 | 0 | 4 | 0 | 4 | 0 | 0 | 0 | 0 | 0 | 0 | 0 |
| P10 | 4 | 0 | 0 | 0 | 0 | 0 | 4 | 0 | 0 | 0 | 0 | 0 |
| P11 | 0 | 0 | 0 | 0 | 0 | 0 | 0 | 0 | 0 | 0 | 0 | 0 |
| P12 | 0 | 0 | 0 | 0 | 0 | 0 | 0 | 0 | 0 | 0 | 0 | 0 |
| P13 | 0 | 0 | 0 | 0 | 0 | 0 | 0 | 0 | 0 | 0 | 0 | 0 |
| P14 | 0 | 0 | 0 | 0 | 0 | 0 | 0 | 0 | 0 | 0 | 0 | 0 |
| P15 | 0 | 0 | 0 | 0 | 0 | 0 | 0 | 0 | 0 | 0 | 0 | 0 |
| P16 | 0 | 0 | 0 | 0 | 0 | 0 | 0 | 0 | 0 | 0 | 0 | 0 |
| P17 | X | X | X | X | X | X | X | X | X | X | X | X |

CNV: P1–P16

FIG. 8B.  BINARY-TO-BCD CHART

| CQI 31 | | CQ RAM 36 | | | CQO 33 | | MUX 43 | CVR REG. 53 | AQI 49 | | AQ RAM 59 | |
|---|---|---|---|---|---|---|---|---|---|---|---|---|
| CQIU | CQIL | INPUT | ADDR. | OUTPUT | CQOU | CQOL | OUTPUT | OUTPUT | AQIU | AQIL | INPUT | ADDR. |
| X | X | XX | 01/FF | 01 | X | X | X | X | X | X | XX | 00 |
| X | X | XX | 01/FF | 01 | X | X | X | X | X | X | XX | 00 |
| X | X | XX | 01/FF | 01 | 0 | 1 | 0 | X | X | X | XX | 00 |
| X | X | XX | 01/00 | 09 | 0 | 1 | 1 | X | X | X | XX | 00 |
| X | 0 | X0 | FF/00 | 09 | 0 | 9 | 0 | 0 | 0 | 0 | 00 | FF |
| 0 | 0 | 00 | FF/FF | 00 | 0 | 9 | 9 | 0 | 0 | 1 | 01 | FF |
| 0 | 0 | 00 | 00/FF | 00 | 0 | 0 | 0 | 0 | 2 | 9 | 29 | FF |
| 0 | 4 | 04 | 00/00 | 04 | 0 | 0 | 0 | 4 | 7 | 3 | 73 | FF |
| 4 | 0 | 40 | FF/00 | 04 | 0 | 4 | 0 | 0 | 0 | 0 | 00 | FE |
| 0 | 0 | 00 | FF/FF | 00 | 0 | 4 | 4 | 0 | 0 | 0 | 00 | FE |
| 0 | 0 | 00 | 00/FF | 00 | 0 | 0 | 0 | 0 | 0 | 0 | 00 | FE |
| 0 | 0 | 00 | 00/00 | 00 | 0 | 0 | 0 | 0 | 0 | 4 | 04 | FE |
| 0 | 0 | 00 | FF/00 | 00 | 0 | 0 | 0 | 0 | 0 | 0 | 00 | FD |
| 0 | 0 | 00 | FF/FF | 00 | 0 | 0 | 0 | 0 | 0 | 0 | 00 | FD |
| 0 | 0 | 00 | 00/FF | 00 | 0 | 0 | 0 | 0 | 0 | 0 | 00 | FD |
| 0 | 0 | 00 | 00/00 | 00 | 0 | 0 | 0 | 0 | 0 | 0 | 00 | FD |
| 0 | 0 | 00 | FF/00 | 00 | 0 | 0 | 0 | 0 | 0 | 0 | 00 | FC |
| X | X | XX | FF/FF | XX | X | X | X | X | X | X | XX | FC |

NUMBER CONVERSION APPARATUS

BACKGROUND OF THE INVENTION

1. Field of the Invention

This invention relates to an improved apparatus and method for converting binary coded decimal (BCD) numbers to binary numbers in a first mode of operation or for converting binary numbers to BCD numbers in a second mode of operation.

2. Description of the Prior Art

Many systems and apparatuses for converting between binary and binary coded decimal (BCD) numbers have been proposed and are well known in the art.

Some proposed systems can only convert BCD to binary, while other systems can only convert binary to BCD. Various approaches for converting from BCD to binary are described in the article "A Method for High Speed BCD-to-Binary Conversion", L.C. Beougher, Computer Design, March 1973, pp. 53–59. Similarly, approaches for converting from binary to BCD are described in the article "Binary-to-BCD Conversion with Complex IC Functions", John R. Linford, Computer Design, September 1970, pp. 53–61.

On the other hand, some proposed systems have the capability for converting both binary numbers to BCD and BCD numbers to binary. Examples of such dual operational capabilities are taught in U.S. Pat. Nos. 3,449,555 and 3,882,483.

U.S. Pat. No. 3,449,555 teaches the parallel conversion of signals representing multi-bit binary numbers to signals representing binary-coded decimal numbers and of signals representing binary-coded decimal numbers to binary numbers. A single modular logic net is used for each conversion.

In U.S. Pat. No. 3,882,483 read only memories include a programmed mapping between the binary and binary coded decimal codes. Input to the read only memory in one code is converted to an output in the other code. The outputs from the read only memories are then summed to produce the desired conversion.

However, in both of the above-referenced U.S. Patents, the same structure used for one type of conversion cannot be used for the other type of conversion. A different structural configuration, as well as signal flow, is required for each of the two types of conversion circuits in each of these referenced U.S. Patents.

Thus, none of the above-described systems teaches an apparatus which is capable of utilizing the same structure and signal flow to perform a conversion from BCD to binary in one mode of operation and from binary to BCD in another mode of operation.

SUMMARY OF THE INVENTION

Briefly an improved apparatus is provided for converting a BCD number to a binary form in a first mode of operation and for converting a binary number to a BCD form in a second mode of operation.

In a preferred embodiment of the invention, two-digit characters of an input number to be converted, as well as subsequent interim two-digit characters from a combining circuit, are selectively stored in predetermined addressable storage locations of an addressable storage circuit. A developing circuit is selectively responsive to each character read out from a storage location and to an associated lower digit of each delayed odd character from a delay circuit for developing an odd addend and an odd multiplier.

The odd addend and odd multiplier are utilized by a first conversion circuit to develop an odd character which is equal to the sum of the odd addend and the product of the odd multiplier and a preselected multiplicand. This preselected multiplicand is equal to ten in the first mode of operation and to sixteen in the second mode of operation. The odd character is delayed by the delay circuit to produce the delayed odd character.

A second conversion circuit utilizes an even multiplier from an output circuit and the upper digit of the delayed odd character as an even addend to develop an even character which is equal to the sum of the even addend and the product of the even multiplier and the preselected multiplicand.

A combining circuit selectively combines consecutive pairs of the upper digits of even characters into interim characters which are selectively stored in the predetermined storage locations of the addressable storage circuit. The output circuit is selectively responsive to associated lower digits of the even and delayed odd characters for developing even multipliers and the converted output number.

It is, therefore, an object of this invention to provide an improved number conversion apparatus for converting between BCD and binary numbers.

Another object of this invention is to provide a number conversion apparatus which uses the same structure and same signal flow for converting from BCD to binary as it does for converting from binary to BCD.

A further object of this invention is to provide a number conversion apparatus that can readily utilize a variable word length operand in converting between BCD and binary numbers.

BRIEF DESCRIPTION OF THE DRAWINGS

These and other objects, features and advantages of the invention, as well as the invention itself, will become more apparent to those skilled in the art in the light of the following detailed description taken in consideration with the accompanying drawings wherein like reference numerals indicate like or corresponding parts throughout the several views and wherein:

FIGS. 2, 2A, 2B are a detailed schematic block diagram of the preferred embodiment of the invention;

FIG. 6 illustrates the various addresses for the counters shown in FIGS. 2 and 3 during the clock periods of an exemplary conversion operation;

FIGS. 7, 7A, 7B are a BCD-to-Binary chart illustrating the contents of various components in the preferred embodiment of FIG. 2 during the clock periods of an exemplary BCD-to-binary conversion; and FIGS. 8A and 8B are a Binary-to-BCD chart illustrating the contents of various components in the preferred embodiment of FIG. 2 during the clock periods of an exemplary binary-to-BCD conversion.

DESCRIPTION OF THE PREFERRED EMBODIMENT

Figure 1:
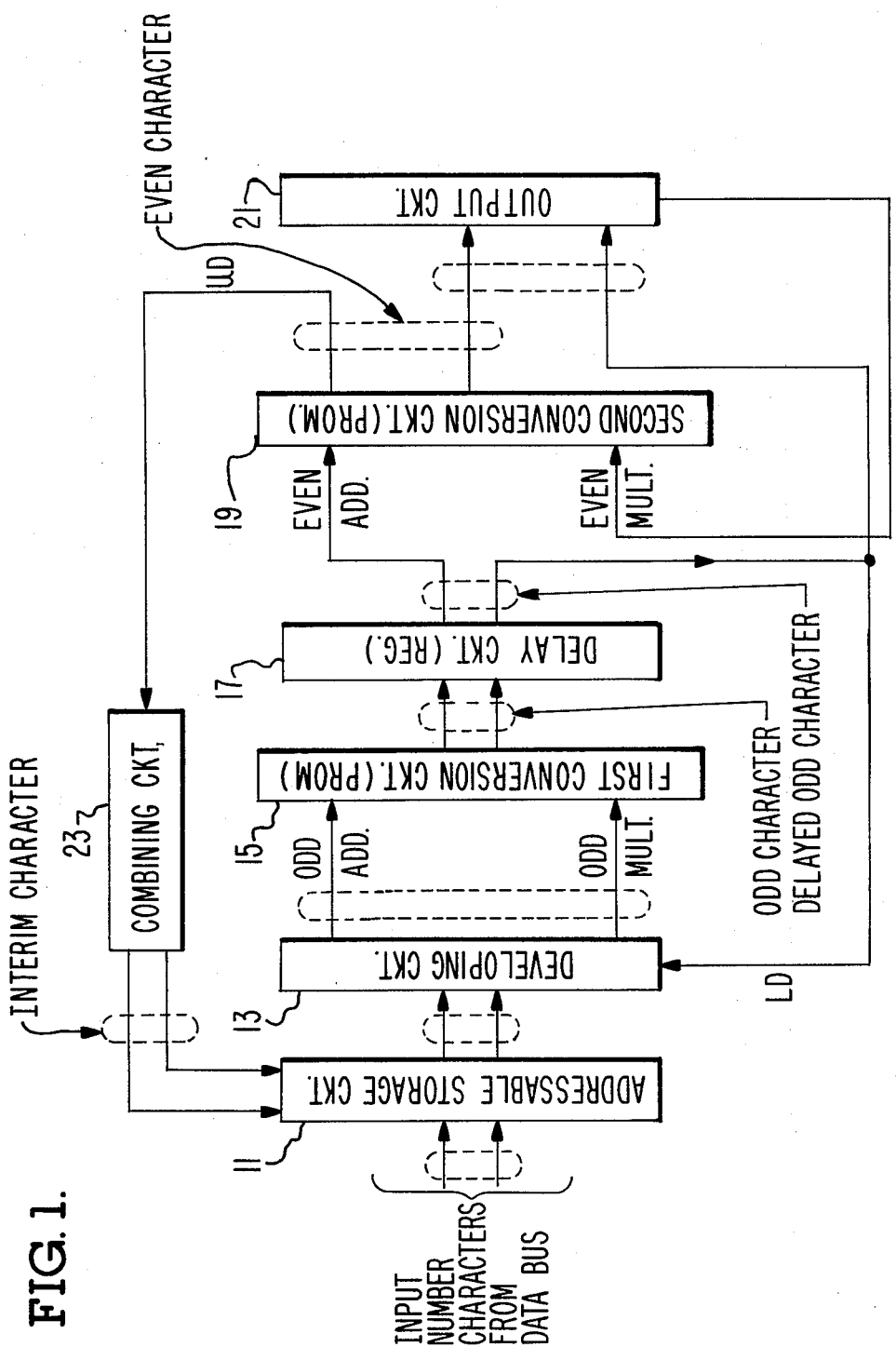
FIG. 1 is a simplified schematic block diagram of a preferred embodiment of the invention.

Referring now to the drawings, FIG. 1 discloses a simplified schematic block diagram of a preferred embodiment of the invention. An input number to be converted, which may be either binary coded decimal (BCD) or binary in form, is comprised of at least one character. For purposes of this description, each character is two digits wide, with each digit being four bits in width. The more significant digit in a character will be described as the upper digit (UD), while the less significant digit in that character will be described as the lower digit (LD). Furthermore, hexadecimal notation will be used throughout this description of the invention to show the amplitude of any given digit.

Each two-digit character of the input number to be converted is sequentially applied from some suitable source (not shown), through a data bus, to an addressable storage circuit 11 which selectively stores the characters of the input number in predetermined storage locations (not shown).

During a conversion operation, the two-digit characters stored in the storage circuit are selectively read out of their associated storage locations and applied to a developing circuit 13. The developing circuit 13 is selectively responsive to each character read out of the storage circuit 11 and to an associated lower digit (LD) from the output of a delay circuit or register 17 for developing an output character having an upper digit that is used as an odd addend and a lower digit that is used as an odd multiplier.

A first conversion circuit or PROM 15 is responsive to the odd addend and to the odd multiplier for developing an odd character, which is equal to the sum of the odd addend and the product of the odd multiplier and a preselected multiplicand. The odd character is delayed by the delay circuit 17 to produce a delayed odd character. The upper digit of this delayed odd character is applied as an even addend to a second conversion circuit or PROM 19. The lower digit of the delayed odd character from the delay circuit 17 is applied to the developing circuit 13 (as discussed before) and to an output circuit 21. At the same time a digit from the output circuit 21 is developed as an even multiplier.

The second conversion circuit 19 is responsive to the even addend and even multiplier for developing an even character, which is equal to the sum of the even addend and the product of the even multiplier and the same preselected multiplicand used in the first conversion circuit 15. Each pair of upper digits from each pair of consecutive even characters is selectively combined by a combining circuit 23 into an interim character which is stored in an associated one of the predetermined storage locations of storage circuit 11.

The output circuit 21 is responsive to the lower digit of the even character and the lower digit of the delayed odd character for developing the even multiplier.

The conversion operation of the apparatus of FIG. 1 continuously repeats as a function of the number of characters in the input number being converted. During the conversion operation, the output circuit 21 is also selectively responsive to the lower digits of the even and delayed odd characters for developing the characters of the converted output number. After the output circuit 21 has completely developed the converted output number, it stops the conversion operation.

Figure 2B:
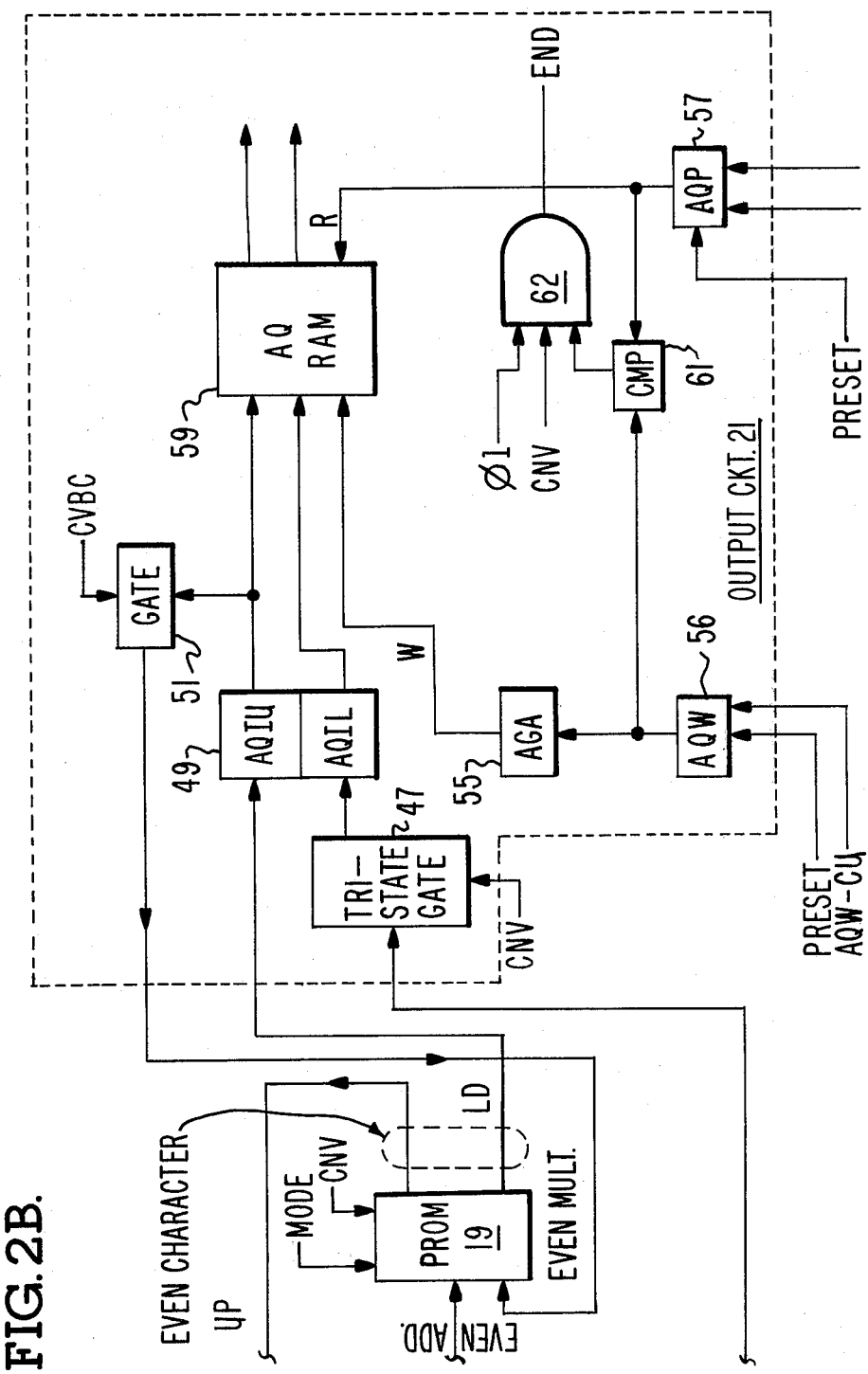

Referring now to FIG. 2, a more detailed schematic block diagram of the preferred embodiment of the invention is illustrated. A clock generator 29 supplies phase one ($\phi1$) and phase two ($\phi2$) clocks, having the same frequency but phase-displaced from each other, for the proper operation of the apparatus of FIG. 2. As shown in FIG. 2, the addressable storage circuit 11 is a typical queue (Q) circuit which is comprised of registers CQI 31, CQA 32 and CQO 33, up-down counters CQW 34 and CQP 35, and CQ RAM 36. The register 31 is comprised of upper (U) and lower (L) portions CQIU and CQIL, respectively. Similarly, the register 33 is comprised of upper and lower portions CQOU and CQOL, respectively.

The two digits in each character of the input number to be converted are parallel-fed from an input bus through an enabled conventional tri-state gate 39 into the CQIU and CQIL portions, respectively, of the register 31, and then are selectively written into predetermined address locations of the RAM 36 before the conversion operation is to begin.

A tri-state gate, such as the gate 39, passes its input digital signals when it is enabled and develops a high impedance output when it is disabled. The gate 39 remains enabled by a 1-state $\overline{CVN}$ signal before the conversion operation begins.

Before the input number to be converted is stored in the RAM 36, the counters CQW 34 and CQP 35 are each preset to a home position FF. This home position FF in CQW counter 34 is clocked into the CQA register 32 on the next $\phi2$ clock. It is the output of the CQA register 32 which is used as the write address for the RAM 36. The first character of the input number is stored in the FF address. Each time that a character is written into the RAM 36, the CQW counter 34 is incremented by one, which in turn causes the CQA register 32 to change its address by one. Thus, for a three-character input number, the three characters of that number would be respectively written into RAM 36 address locations FF, 00 and 01. To avoid destroying the information in address location 01, the counter CQW 34 would be incremented by one to cause the CQA register 32 to store a write address of 02. As a consequence, the number of count positions of the CQW counter 34 from its home position FF would indicate the number of characters in the input number that is stored in CQ 11. For example, if CQW counter 34, and hence CQA register 32, had an address count of 01 just prior to a conversion operation, the input number would be two characters in length. This is due to the fact that the count position of the CQW counter 34 would be two positions away from its home position FF.

The reception of a "start CNV" signal (FIG. 3, to be explained) causes the generation of a 1-state CNV signal to start the conversion operation. Immediately thereafter the gate 39 is disabled by the 0-state $\overline{CNV}$ signal, while a tri-state gate 41 in combining circuit 23 is enabled to subsequently develop and apply interim characters to the register 31. At the same time, write addresses developed by the CQP counter 35, as a function of the binary states of CQP-load (CQP-LD) and CQP-countup (CQP-CU) signals, enable the RAM 36 to sequentially read out the characters stored in the addressed locations.

Each character from the RAM 36 is clocked into the register 33, with the more significant digit being stored in the CQOU portion and the less significant digit being stored in the CQOL portion of the register 33. The upper and lower digits of each character from register 33 are selectively time division multiplexed by a multiplexer 43 in the developing circuit 13 to develop a pair of consecutive odd addends for the PROM 15. The multiplexer 43 is controlled by the binary state of an FFA signal. When FFA=0, the multiplexer 43 outputs the digit stored in CQOL. When FFA=1, the multiplexer 43 outputs the digit stored in CQOU.

At the same time that an odd addend is being developed, the lower digit (LD) from the BQIL portion of register 17 is applied to the input of gate 45, also contained in the developing circuit 13. The gate 45 is controlled by the binary state of a CVAC signal, such that the lower digit stored in BQIL is passed through the gate 45 only when CVAC=1. When CVAC=0, the output of the gate=0. This output of the gate 45 is the odd multiplier that is applied to the PROM 15.

The CNV signal also enables the PROM 15 to develop an odd character in response to each odd addend and corresponding odd multiplier applied to the PROM 15. Each output odd character is equal to the sum of the odd addend and the product of the odd multiplier and a preselected multiplicand. The odd character is delayed for one clock period by register 17 in order to develop the delayed odd character.

The lower digit of the delayed odd character from the BQIL portion of register 17 is applied to the gate 45 and also through an enabled tri-state gate 47 to an AQIL portion of a register 49 in the output circuit 21. Gate 47 is also enabled by the CNV signal.

The upper digit of the delayed odd character from BQIU in the register 17 is the even addend that is applied to the PROM 19. An associated even multiplier for the PROM 19 is applied from a gate 51 in the output circuit. Gate 51 is controlled by the binary state of a CVBC signal. When CVBC=1, the output from the AQIU portion of the register 49 is passed through gate 51 as the even multiplier for PROM 19. When CVBC=0, the gate 51 is closed and develops an output=0 which is used as the even multiplier for PROM 19.

Like the PROM 15, the PROM 19 is enabled by the CNV signal to develop output characters during the time the CNV signal is applied. In response to each associated even addend and even multiplier applied to the PROM 19 during the CNV period, the PROM 19 develops an associated even character. This even character is equal to the sum of the even addend and the product of the even multiplier and the same preselected multiplicand used in the PROM 15.

Consecutive upper digits of the even character from PROM 19 are concurrently applied to a CVR register 53 in combining circuit 23 and also directly through the combining circuit 23 to the CQIL portion of register 31. The CVR register 53 delays each of these upper digits by one clock pulse period before sequentially applying each digit through the enabled tri-state gate 41 to the CQIU portion of the register 31. As discussed before, this tri-state gate 41 is enabled by the CNV signal. Thus, the two signal paths, one delayed by the CVR register 53 and the other undelayed, enable each consecutive pair of upper digits from the PROM 19 to be combined into an interim character which is then clocked into the CQI register 37 for subsequent storage in the CQ RAM 36.

The CQW-LD and CQW-CU signals selectively control the count of the up-down CQW counter 34, and hence the write addresses from the CQA register 32 to the RAM 36.

In addition to gates 47 and 51 and AQI register 49, the output circuit 21 also includes AQA register 55, up-down counters AQW 56 and AQP 57, AQ RAM 59, a comparator (CMP) 61 and an AND gate 62. The registers 49 and 55, counters 56 and 57 and RAM 59 are similar in structure and operation to the registers 31 and 32, counters 34 and 35 and RAM 36, respectively, and hence require no further description.

Before the conversion operation starts, the AQW counter 56 is preset to 00. This count is applied to the AQA register 55 on the next $\phi 2$ clock and is the initial write address for the RAM 59 at the start of the conversion operation. During the conversion operation, an AQW-count up (AQW-CU) signal selectively controls the count of the AQW counter 56, and hence the write address from the AQA register 55 to the RAM 59.

It will be recalled that after the input number to be converted was stored in the CQ RAM 36, the count of the CQW counter 34 from its home position FF indicated the number of characters in the input number. Pursuant to this, the AQP counter 57 is preset to a predetermined number of positions from its home position FF. This predetermined number is a function of the type of number conversion to be performed and the number of positions that the CQW counter 34 had counted to from its home position in the storing of the input number in RAM 36. For example, if CQW counter 34 had counted from FF to 01, which indicated a two-character input number stored in the RAM 36, the AQP counter 57 would be preset from the home position FF to FD for a BCD-to-Binary conversion and to FC for a binary-to-BCD conversion.

The comparator 61 compares the write address contained in the AQA register 55 with the read address of the preset AQP counter 57. When the two addresses become equal to each other, the comparator 61 develops and applies a 1-state signal to the bottom input of AND gate 62. Applied to the upper two inputs of AND gate 62 are the $\phi 1$ clock and the CNV signal. Upon coincidence of the $\phi 1$ clock, the CNV signal and the 1-state output of the comparator 61, the AND gate develops a 1-state END pulse which causes the termination of the CNV signal one clock period later (to be explained).

In the operation of each of the CQ and AQ RAMs 36 and 59, respectively, a "write" cycle is followed by a "read" cycle. The $\phi 2$ clock is only used by the registers CQA 32 and AQA 55 to control the timing of the "write" cycle, while the $\phi 1$ clock is used by counters CQP 35 and AQP 57 to control the timing of the "read" cycle. In addition, the remaining components of FIG. 2 also use the $\phi 1$ clock.

Also applied to both of the PROMs 15 and 19 is a "mode" signal which determines what type of number conversion is to be performed during a conversion operation. This mode signal is a binary signal which could be contained in a microinstruction, initiated by an operator or derived from some other suitable source. In any event, when the mode signal=1, a BCD-to-binary number conversion is desired and the PROMs 15 and 19 are forced to use look-up tables in which the preselected multiplicand=10. On the other hand, when the mode signal=0, a binary-to-BCD number conversion is desired and the PROMs 15 and 19 are forced to use look-up tables in which the preselected multiplicand is equal to sixteen.

The control signals used in the apparatus of FIG. 2 as well as additional control signals (to be explained), are developed according to the following equations:

$$FFA \longleftarrow CNV \cdot \overline{FFA} \quad (1)$$
$$FFB \longleftarrow \overline{BQP\,[MSB]} \quad (2)$$
$$AQW\text{--}CU = CNV \cdot FFA \cdot BQP\,[MSB] \quad (3)$$
$$BQP\text{--}LD = CNV \cdot FFA \cdot (BMT\text{--}EQ) \quad (4)$$
$$BQP\text{--}CU = CNV \cdot FFA \cdot (\overline{BMT\text{--}EQ}) \quad (5)$$
$$CQW\text{--}LD = CNV \cdot FFA \cdot BQP\,[MSB] \quad (6)$$
$$CQW\text{--}CU = CNV \cdot FFA \cdot \overline{BQP\,[MSB]} \quad (7)$$
$$CQP\text{--}LD = CNV \cdot FFA \cdot (BMT\text{--}EQ) \quad (8)$$
$$CQP\text{--}CU = CNV \cdot FFA \cdot (\overline{BMT\text{--}EQ}) \quad (9)$$
$$CVAC = \overline{FFA} + \overline{BQP\,[MSB]} \quad (10)$$
$$CVBC = FFB + BQP\,[MSB] \quad (11)$$

Equations (1) through (11) are shown implemented in FIG. 3, which will now be discussed.

The leading edge of the "start CNV" signal sets RS flip-flop 63 to develop the 1-state CNV signal at its 1 output. When the "END" pulse is generated by AND gate 62 (FIG. 2) (indicating that the write address in AQA register 55 is equal to the preset read address in AQP counter 57), that "END" pulse is delayed for one clock period by delay circuit 65 to produce an "END CNV" pulse which resets the flip-flop 63 to terminate the CNV signal and, hence, the conversion operation.

The development of the FFA signal will now be discussed by referring to both FIGS. 3 and 4. FIG. 4 shows waveforms for CNV, FFA and $\overline{FFA}$ (the 1 and 0 outputs, respectively, of flip-flop 67) and the multiplexer 69 output to the flip-flop 67, all during clock periods $P_0, P_1 \ldots P_{13}$.

The FFA signal is developed at the 1 output of D-flip-flop 67, which has both of its 1 and 0 outputs applied to a multiplexer 69. When CNV=0, multiplexer 69 selects and applies the 1 side of flip-flop 67 back to the D input of the flip-flop. Thus, as indicated in FIG. 4 for period $P_0$ the multiplexer 69 continuously circulates a 0-state FFA output back to the D input of flip-flop 67. However, during the conversation operation which, according to FIG. 4, occurs during periods $P_1$ through $P_{12}$, CNV=1. This 1 state CNV signal enables the multiplexer 69 to feed the 0 side output ($\overline{FFA}$) of flip-flop 67 back to its D input. As a result, the FFA signal is complemented during the period of the conversion operation (when CNV=1).

A BQW counter 71 and a BQP counter 73 have their outputs compared in a comparator 75. The counters 71 and 73 and comparator 75 are similar in structure and operation to the counters 56 and 57 and comparator 61 previously discussed. The counters BQW 71 and BQP 73 are preset to 00 and to the home position FF, respectively, before a conversion operation begins. The binary states of load signal BQP-LD and count up signal BQP-CU control the count of BQP counter 73 during the conversion operation. When the most significant digit of the output of counter 73 is equal to a binary 1, a 1-state BQP [MSB] signal is generated. When the counts of the counters 71 and 73 are equal to each other, the comparator develops a 1-state BMT-EQ signal.

The CNV, FFA and BMT-EQ signals are applied to AND gate 81 to enable that gate to develop the BQP-LD and CQP-LD control signals. Signal BMT-EQ is also inverted by NAND gate 82 and applied along with the CNV and FFA signals to AND gate 83 to enable the gate 83 to develop the BQP-CU and CQP-CU control signals.

Signals CNV, FFA and BQP [MSB] are applied to AND gate 85 to enable gate 85 to develop the AQW-CU and CQW-LD control signals. The signal BQP [MSB] is also inverted by NAND gate 86 and applied to AND gate 87, OR gate 89 and the input of D-flip-flop 91. The CNV and FFA signals are also applied to AND gate 87 to enable the gate 87 to develop the CQW-CU control signal.

The FFA signal is inverted by NAND gate 93 and also applied to the OR gate 89, along with the inverted BQP [MSB] signal, to enable OR gate 89 to develop the CVAC control signal.

In response to the inverted BQP [MSB] signal, flip-flop 91 develops the FFB control signal at its 1 output. The FFB and BQP [MSB] signals are applied to an OR gate 95 to enable the OR gate to develop the CVBC control signal.

Figure 3:
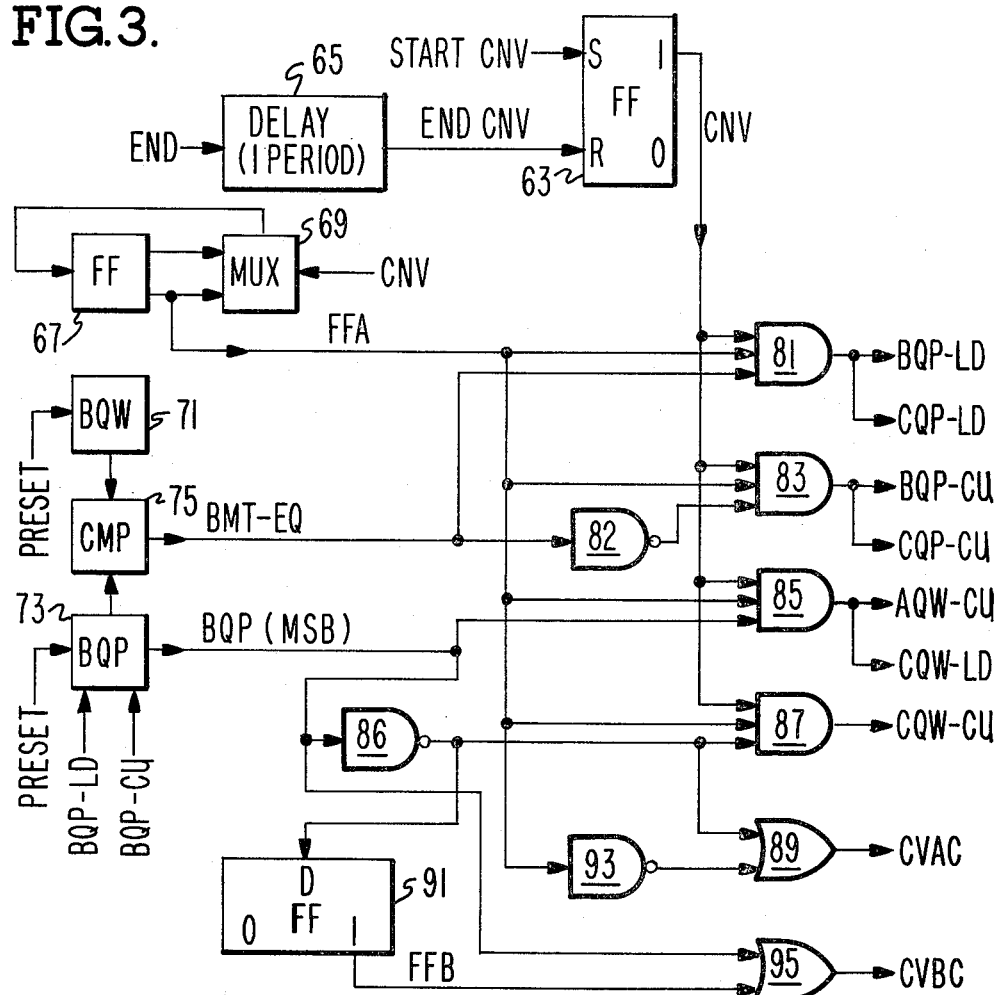
FIG. 3 is a schematic block diagram of a control circuit for generating the various control signals used in the preferred embodiment of FIG. 2.
Figure 4:
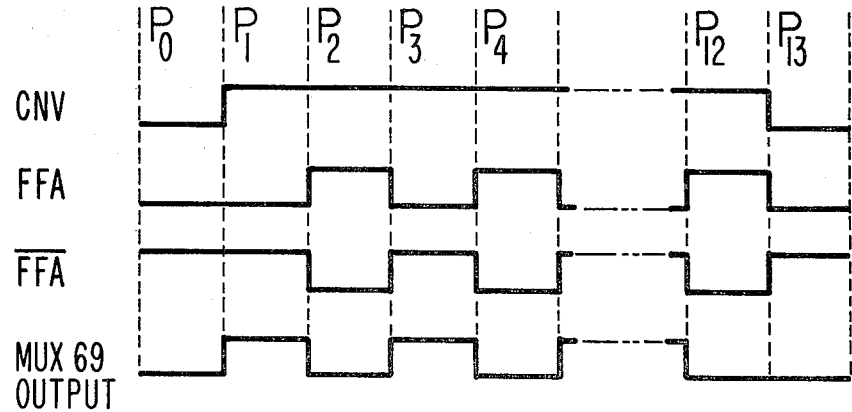
FIG. 4 illustrates waveforms useful in explaining the operation of the control circuit of FIG. 3.

The various terms in equations (1) through (11) can now be defined as follows:

CNV = the 1 output of flip-flop 63 (FIG. 3)
FFA = the 1 output of flip-flop 67 (FIG. 3)
FFB = the 1 output of flip-flop 97 (FIG. 3)
BQP [MSB] = the most significant bit in the output count of BQP counter 73 (FIG. 3)
(BMT-EQ) = a binary 1 when the counts of the counters BQW 71 and BQP 73 are equal (FIG. 3)

The actions required of the control signals developed in equations (1) through (11) are as follows:

Eq. (1)—Complement the FFA output of flip-flop 67 each clock period during CNV.
Eq. (2)—Change the FFB output of flip-flop 97 to the complement of the most significant digit of BQP 73 each clock period during CNV.
Eq. (3)—Count up AQW counter 56 by one on the trailing edge of AQW-CU.
Eq. (4)—Reset the BQP counter 73 to its home position FF on the falling edge of BQP-LD.
Eq. (5)—Count up BQP counter 73 by one on the trailing edge of AQW-CU.
Eq. (6)—Reset CQW counter 34 to its home position FF on the falling edge of CQW-LD.
Eq. (7)—Count up CQW counter 34 by one on the falling edge of CQW-CU.
Eq. (8)—Reset CQP counter 35 to its home position FF on the falling edge of CQP-LD.
Eq. (9)—Count up CQP counter 35 by one on the falling edge of CQP-CU.
Eq. (10)—Enable gate 45 when either FFA or BQP [MSB]=0.
Eq. (11)—Enable gate 51 when either FFB or BQP [MSB]=1.

The operation of the apparatus of FIG. 2 will now be discussed for a BCD-to-binary conversion and then for a binary-to-BCD conversion. For ease of explanation and understanding, a two-character long input number will be used in the discussion of both types of conversion. However, it should be understood that a shorter input number of one character in length or a much longer input number could just as readily be used. This is due to the fact that the number conversion apparatus being described can readily utilize an input number of highly variable word length in converting between BCD and binary numbers.

Figure 5:
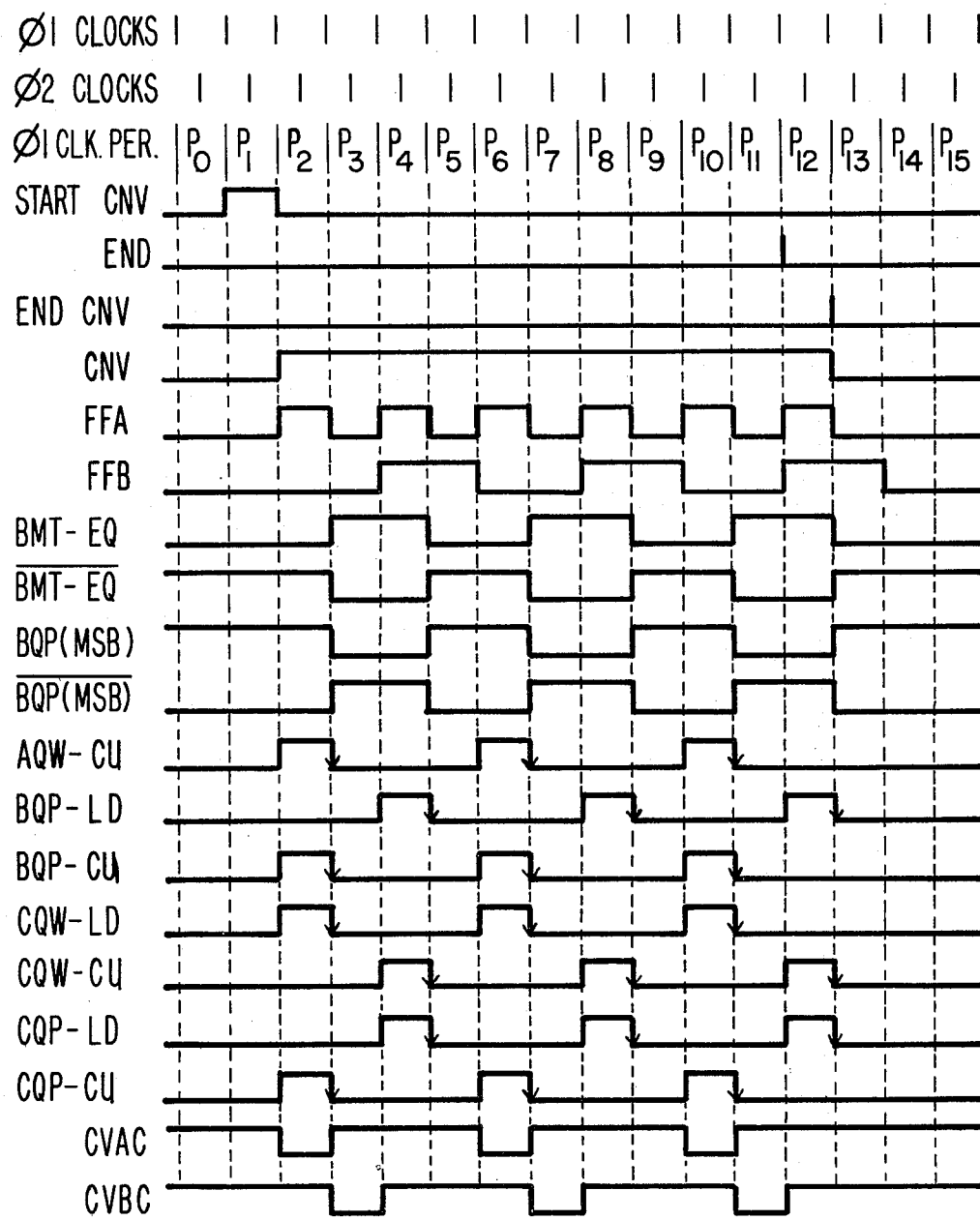
FIG. 5 illustrates waveforms of various control signals substantially generated by the control circuit of FIG. 3 to control the operation of the preferred embodiment of FIG. 2.

Before a detailed discussion on the dual conversion operation is begun, the waveforms of various signals, as well as the counts of various counters, used in the apparatus of FIG. 2 will be briefly discussed for a two-character input BCD number by now referring to FIGS. 5 and 6. It should be understood that the waveforms shown in FIG. 5 and the counts of the various counters and registers used in the invention, that are shown in FIG. 6, would be different for input BCD numbers of a different word length as well as for binary-to-BCD number conversions.

In FIG. 5, the $\phi 1$ and $\phi 2$ clocks are shown for $\phi 1$ clock periods $P_0, P_1 \ldots P_{15}$. The "start CNV" signal occurs at the end of the period $P_0$ to start the generation of the CNV signal or gate. For the two-character long number conversion, the "END" pulse is not generated by AND gate 62 until the end of the period $P_{11}$. As a result, the "end CNV" pulse terminates the CNV gate, and hence the conversion operation, at the end of period $P_{12}$. Thus, the conversion operation lasts for the duration of the CNV gate, namely during the twelve clock periods $P_1$-$P_{12}$.

It is the initial address counts of the counters AQW 56, AQP 57, BQW 71, BQP 73, CQW 34 and CQP 35 and registers AQA 55 and CQA 32 before a CNV period starts ($P_0$) and their subsequent address counts during a CNV period ($P_1 \ldots P_{12}$) which controls the number conversion operation of the invention.

As shown in FIG. 6 and discussed previously, during the clock period $P_0$ (which occurs sometime after the storage of a two-character input number in the RAM 36 and before a CNV period starts) counter CQW 34 has an address count of 01 (indicative of two characters in the input number); register CQA 32 contains a write address of 01 (from the prior count of counter CQW 34); counter AQP has an address count of FD (like the count of counter CQW 34—equal to two positions from its home position FF for a BCD-to-binary conversion); counters AQW 56, BQW 71, BQP 73 and CQP 35 have been preset to contain address counts of 00, 00, FF and FF, respectively; and register AQA 55 contains a write address of 00 (from the prior count of counter AQW 56).

Values of the remaining control signals shown in FIG. 5 determine the subsequent address counts of the counters 56, 57, 71, 73, 34 and 35 and registers 55 and 32 shown in FIG. 6 during the CNV period ($P_1 \ldots P_{12}$) and after the CNV period ($P_{13} \ldots P_{15} \ldots$). The values of the FFA, FFB, AQW-CU, BQP-LD, BQP-CU, CQW-LD, CQW-CU, CQP-LD, CQP-CU, CVAC, CVBC signals shown in FIG. 5 have been derived from the above equations (1) through (11) for the clock periods $P_1 \ldots P_{15}$. The waveforms for the BMT-EQ and BQP MSB signals and their negations, which are also shown in FIG. 5, are elements of equations (2) through (11) and are derived from the counts of the counters BQW 71 and BQP 73 for the clock periods $P_1 \ldots P_{15}$. Signal BMT-EQ is equal to a binary 1 when BQW=BQP which, as seen in FIG. 6, occurs during clock periods $P_3$, $P_4$, $P_7$, $P_8$, $P_{11}$ and $P_{12}$. Signal BQP [MSB] is equal to a binary 0 when the most significant digit of BQP=0 which, as also seen in FIG. 6, occurs during clock periods $P_3$, $P_4$, $P_7$, $P_8$, $P_{11}$ and $P_{12}$.

For the sake of consistency and ease of understanding, assume that each counter changes its count on the falling edge of a control signal applied thereto (as indicated in FIGS. 5 and 6) and that (other than flip-flop 63 in FIG. 3) each storage device, such as a flip-flop, register or RAM, clocks input data in on the clocked trailing edge of that input data.

Referring now to FIG. 7, a BCD-to-Binary chart is illustrated for the conversion of an exemplary two-character long input BCD number 0473 (0000 0100 0111 0011) into its equivalent binary number 01D9 (0000 0001 1101 1001). This chart illustrates numbers resulting from the various conversion operations performed by the circuits shown in FIG. 2 during the pre-conversion operation clock period $P_0$, the conversion operation clock periods $P_1 \ldots P_{12}$ and the post-conversion operation clock periods $P_{13} \ldots P_{15}$. As a result, both FIGS. 7 and 2 should be referred to. It should be recalled that for a BCD-to-binary conversion, the mode signal applied to PROMs 15 and 19 (FIG. 2) is a binary 1 to enable the PROMs to only use tables having a multiplicand equal to ten. For purposes of this discussion each separate digit number, i.e., 2 or F in the character 2F, represents the value of a four-bit long digit in hexadecimal notation. Also, each X in the chart of FIG. 7 represents a "don't care" or "garbage" digit, which has "don't care" values.

Periods $P_0$ and $P_1$

As shown in the chart of FIG. 7, the operation of the apparatus of FIG. 2 during each of periods $P_0$ and $P_1$ is substantially identical, even though the conversion operation starts at the beginning of period $P_1$ with the generation of the CNV gate (FIG. 5).

During each of periods $P_0$ and $P_1$ the following described events occur. The characters 04 and 73 of the previously written-in input BCD number 0473 (0000 0100 0111 0011) are respectively contained in address locations FF and 00 of the CQ RAM 36. As shown in FIG. 6 the write (W) address in register CQA 32 and the read (R) address of counter CQP 35 are 01 and FF, respectively. An XX (don't care) character is read into location 01 of RAM 36 during the write portion of a write-read cycle (which uses both of phase clocks $\phi 1$ and $\phi 2$). This 01 RAM location is reserved for "garbage" characters. Similarly, the write (W) address of the AQ RAM 59 from register AQA 55 is 00 (FIG. 6) to enable RAM 59 to store an XX character in its preselected "garbage" location 00 during the write portion of a write-read cycle. The 04 character in location FF of RAM 36 is read out during the following read portion of the write-read cycle. However, all other digits and characters occurring in other circuit components of FIG. 2 are X and XX, respectively.

Period $P_2$

During period $P_2$, the 0 and 4 digits of the more significant input BCD character 04 (0000 0100) that was read out of location FF of RAM 36 during period $P_1$, are respectively stored in the CQOU and CQOL portions of register CQO 33 and thus appear at the two inputs of multiplexer 43. At this time the FFA signal, which controls the operation of the multiplexer 43, is in a 1-state (FIG. 5). As a result, the multiplexer 43 selects the digit 0 from the CQOL portion of CQO register 33 as the odd addend and applies it to the PROM 15. An X (don't care) digit from the BQIL portion of delay register 17 is applied to the input of gate 45. However, during period $P_2$, the 0-state CVAC signal (FIG. 5) disables the gate 45, causing the gate 45 to develop a 0 output digit. The output digit of gate 45 is the odd multiplier that is applied to the PROM 15. Since, during period $P_2$, the odd multiplier=0, the odd addend=0 and the multiplicand=10 (because the mode signal=1 during a BCD-to-binary conversion), the PROM 15 develops an output character=00 (0 times 10 plus 0=00).

Also during period $P_2$, the write address of RAM 59 remains 00, and during the read portion of the write-read cycle, the 04 character is again read out of location FF of RAM 36. All other digits and characters developed by other circuit components of FIG. 2 are X and XX, respectively.

Period $P_3$

During period $P_3$, the write addresses of RAMs 36 and 59 remain 01 and 00, respectively. "Don't care" characters XX and XX from register CQI 31 and AQI 49 are therefore stored in location 01 of RAM 36 and location 00 of RAM 59. The 0 and 4 BCD digits of the 04 character, read out of location FF of RAM 36 during period $P_2$ are again respectively stored in the CQOU and CQOL portions of register CQO 33 and thus again appear at the two inputs of multiplexer 43. But, during period $P_3$, the 0-state FFA signal (FIG. 5) enables the multiplexer 43 to now select the digit 4 from the CQOU portion of register 33 as the odd addend and apply it to the PROM 15. The 0 and 0 digits of the 00 character developed by PROM 15 during previous period $P_2$ are respectively stored in the BQIU and BQIL portions of delay register 17. The 0 digit from the BQIL portion of delay register 17 is passed through gate 45 (which is now enabled by the 1-state CVAC signal (FIG. 5) during period $P_3$) as the odd multiplier to the PROM 15. In response to an odd multiplier=0 and an odd addend=4, the PROM 15 develops an output=04 (0 times 10 plus 4=04).

The 0 digit from the BQIU portion of delay register 17 is used as the even addend by PROM 19. An X stored in the AQIU portion of register AQI 49 is applied to the input of gate 51. However, during period $P_3$, the 0-state CVBC signal (FIG. 5) disables the gate 51 causing the gate 51 to develop a 0 output digit. The output digit of gate 51 is the even multiplier that is applied to the PROM 19. Since, during period $P_3$, the even multiplier=0, the even addend=0 and the multiplicand=10, the PROM 19 develops an output character=00 (0 times 10 plus 0=00).

Also during period $P_3$, the read address of RAM 36 changes to 00. Consequently, during the read portion of the write-read cycle of period $P_3$, and 7 and 3 digits of the less significant input BCD character 73 (0111 0011) are read out of location 00 of the RAM 36.

Period $P_4$

At the start of period $P_4$, the write address of RAM 36 from register CQA 32 changes to FF, while the write address of RAM 59 from register AQA 55 also changes to FF, as shown in FIG. 6. The digits X and 0, which during period $P_3$ were respectively stored in CVR register 53 and developed as the upper digit (UD) output of PROM 19, are now respectively stored in the CQIU and CQIL portions of register CQI 31, and then the character X0 in register CQI 31 is written into location FF of the RAM 36.

The digits 0 and 0 of the character 00, which character was developed at the output of PROM 19 during period $P_3$, are now respectively stored in the CVR register 53 and the AQIU portion of register AQI 49. Similarly, the digit 0, that was stored in the BQIL portion of delay register 17 during period $P_3$, is now clocked into the AQIL portion of register AQI 49. Thus, during period $P_4$, the digits 0 and 0 are respectively stored in the AQIU and AQIL portions of register 49 and then the character 00 in register 49 is written into location FF of the AQ RAM 59.

The BCD digits 7 and 3 of the character 73, that was read out of location 00 of RAM 36 during period $P_3$, are respectively stored in the CQOU and CQOL portions of register CQO 33 and then appear at the two inputs of multiplexer 43. During period $P_4$, the 1-state FFA signal (FIG. 5) enables the multiplexer 43 to select the digit 7 from the CQOU portion of register CQO 33 as the odd addend and apply it to the PROM 15. The digits 0 and 4 of the character 04, developed by PROM 15 during the previous period $P_3$, are respectively stored in the BQIU and BQIL portions of delay register 17. The digit 4 from the BQIL portion of delay register 17 passes through gate 45 (which is still enabled by the 1-state CVAC signal (FIG. 5) during period $P_4$). This digit 4 from the gate 45 is the odd multiplier that is applied to the PROM 15 during period $P_4$. In response to an odd multiplier=4 and an odd addend=7, the internal look-up tables of PROM 15 develop an output character=2F (4 times 10 plus 7=47=0010 1111=2F).

The digit 0 from the BQIU portion of delay register 17 is the even addend that is applied to the PROM 19 during period $P_4$. The digit 0 now stored in the AQIU portion of register AQI 49 passes through gate 51 (which is enabled by the 1-state CVBC signal (FIG. 5) during period $P_4$). This digit 0 from gate 51 is the even multiplier that is applied to the PROM 19 during period $P_4$. In response to an even multiplier=0 and an even addend=0, the internal look-up tables of PROM 19 develop an output character=00 (0 times 10 plus 0=00).

Also, during the read portion of the write-read cycle of period $P_4$, and 7 and 3 digits of the BCD character 73 are again read out of location 00 of the RAM 36.

Period $P_5$

During period $P_5$, each of the write addresses of the RAMs 36 and 59 from registers CQA 32 and AQA 55 remains FF, while the read address of the RAM 36 from counter CQP 35 changes to FF, as shown in FIG. 6. The digits 0 and 0, which during period $P_4$ were respectively stored in CVR register 53 and developed as the upper digit (UD) output of PROM 19, are now respectively stored in the CQIU and CQIL portions of register CQI 31, and then the character 00 in register CQI 31 is written into location FF of RAM 36.

The digits 0 and 0 of the character 00, which was developed at the output of PROM 19 during period $P_4$, are now respectively stored in the CVR register 53 and the AQIU portion of register AQI 49. In a similar manner the digit 4, that was stored in the BQIL portion of delay register 17 during period $P_3$, is now clocked into the AQIL portion of register AQI 49. Therefore, during period $P_5$, the digits 0 and 4 are respectively stored in the AQIU and AQIL portions of register 49 and then the character 04 in register 49 is written into location FF of the AQ RAM 59.

The BCD digits 7 and 3 of the character 73, that was read out of location 00 of RAM 36 during period $P_4$, are respectively stored in the CQOU and CQOL portions of register CQO 33 and then appear at the two inputs of multiplexer 43. But, during period $P_5$, the 0-state FFA signal (FIG. 5) enables the multiplexer 43 to now select the digit 3 from the CQOL portion of register CQO 33 as the odd addend and apply it to the PROM 15. The digits 2 and F of the character 2F, developed by PROM 15 during the previous period $P_4$, are respectively stored in the BQIU and BQIL portions of delay register 17. The digit F from the BQIL portion of delay register 17 passes through gate 45 (which is still enabled by the 1-state CVAC signal (FIG. 5) during period $P_5$). This digit F from gate 45 is the odd multiplier that is applied to PROM 15 during period $P_5$. In response to an odd multiplier=F and an odd addend=3, the PROM 15 develops an output character=99 (15 times 10 plus 3=153=1001 1001=99).

The digit 2 from the BQIU portion of delay register 17 is the even addend that is applied to the PROM 19 during period $P_5$. The digit 0 now stored in the AQIU portion of register AQI 49 passes through gate 51 (which is still enabled by the 1-state CVBC signal (FIG. 5) during period $P_5$). This digit 0 from gate 51 is the even multiplier that is applied to the PROM 19 during period $P_5$. In response to an even multiplier=0 and an even addend=2, the PROM develops an output character=02 (0 times 10+2=02).

During the read portion of the write-read cycle of period $P_5$, and 0 and 0 digits of the character 00 are read out of location FF of the RAM 36.

Periods $P_6$ through $P_{12}$

The conversion operation continues during the remaining periods $P_6$ and $P_{12}$ of the conversion operation in the same manner as previously described in each of periods $P_4$ and $P_5$. By referring to FIGS. 7, 2 and 5, note that an odd multiplier=0 is also developed at the output of gate 45 during periods $P_6$ and $P_{10}$, since the gate 45 is disabled by a 0-state of the CVAC signal during those periods. Furthermore, by again referring to FIGS. 7, 2 and 5, note that an even multiplier=0 is also developed at the output of gate 51 during periods $P_7$ and $P_{11}$, since the gate 51 is disabled by a 0-state of the CVBC signal during those periods.

During period $P_7$ the less significant character D9 of the converted binary number is written into location FF of AQ RAM 59. At the start of period $P_8$ the write address of the RAM 59 from register AQA 55 changes to FE to prevent any subsequent writing over the stored less significant character D9. The write address of RAM 59 remains FE through periods $P_8$, $P_9$, $P_{10}$ and $P_{11}$. During period $P_{11}$ the more significant character 01 of the converted binary number is written into location FE of AQ RAM 59. At the start of period $P_{12}$ the write address of RAM 59 from register AQA 55 changes to the next address FD to prevent any subsequent writing over the stored more significant character 01. The write address of RAM 59 remains FE through period $P_{12}$.

For a two-character BCD-to-binary conversion the CNV gate, and hence the conversion operation, terminates at the end of period $P_{12}$. During subsequent periods, such as period $P_{13}$, the apparatus of FIG. 2 generates "don't care" digits and characters. The characters D9 and 01 of the converted binary number 01D9 are respectively stored in the two locations FF and FE of the AQ RAM 59, and may be read out of the RAM 59 whenever needed or required.

The binary number 01DF represents the digits 0000 0001 1101 1001 which collectively equal the binary number 111011001. Thus, this converted binary number is the binary equivalent of the input BCD number 0473.

It should be mentioned at this time that the maximum BCD number that can be used in a two-character BCD-to-binary conversion operation is 9999. The equivalent binary number for BCD number 9999 is 270F or 0010 0111 0000 1111. Therefore, no problem is encountered in such a BCD-to-binary conversion, since the conversion of a two-character input BCD number will produce a two-character output binary number. This was the case in relation to the table of FIG. 7. For purposes of the table of FIG. 7, with a two-character input BCD number the counter AQP 57 was preset to FD. This preset of counter 57 to FD resulted in the termination of the CNV gate, and hence the conversion operation, at the end of the first period ($P_{12}$) during which the comparator 61 produced an "END CNV" pulse. At that time the complete binary number was stored in the RAM 59.

A different situation is encountered in a binary-to-BCD conversion operation. With such a conversion, the maximum input binary number that can be used is FFFF, which is equal to the three-character long BCD number 065535. Such a possible situation is encountered in relation to FIG. 8. To resolve such a possible problem with a two-character input binary number, the counter AQP 57 is preset to FC, which is three positions away from the home position of counter 57. The counter CQW 34, and hence the register CQA 32 will each still contain an address count which is two positions away from the home position of counter 34. Thus, the CNV gate, and hence the conversion operation, will be sufficiently long to enable a three-character BCD number to be stored in address locations FF, FE and FD of the AQ RAM 59 before the "END CNV" pulse is developed by comparator 61 to terminate the CNV gate.

FIG. 8 illustrates the various signal values in the different components of FIG. 2 for a binary-to-BCD conversion operation over periods $P_0$, $P_1$ ... $P_{17}$. The characters 01 and D9 of the input binary number 01D9 are initially respectively stored in locations FF and 00 of CQ RAM 36.

The signal path flow and circuit operation for the binary-to-BCD conversion are the same as those previously described in relation to the BCD-to-binary conversion of FIG. 7. However, for a binary-to-BCD number conversion operation (as shown in FIG. 8), the "mode" signal applied to each of the PROMs 15 and 19 is changed to a binary 1. As discussed before, a "mode" signal=1 forces the PROMs 15 and 19 to use look-up tables in which the preselected multiplicand=16. Furthermore, with the binary-to-BCD conversion of FIG. 8, the counter AQP 57 is preset to address location FC to cause the generation of a longer CNV period within which an output three-character BCD number can be developed from an input two-character binary number. This longer CNV period encompasses periods $P_1$ ... $P_{16}$, as shown in FIG. 8.

With a longer CNV period (than that shown for FIG. 7), the waveforms of FIG. 5 and the address locations of FIG. 6 are still valid for the periods $P_0$, $P_1$ ... $P_{12}$, with the exception that the address location of counter AQP 57=FC during each of those periods. However, the waveforms of FIG. 5 and changing address locations of FIG. 6 will continue their periodic changes during the rest of the CNV period (from period $P_{13}$ ... $P_{16}$). Equations (1) through (11) are still valid for a binary-to-BCD conversion and can be readily used to determine the remaining states of the waveforms of FIG. 5 and address locations of FIG. 6 for the remaining periods $P_{13}$ ... $P_{16}$ of the conversion operation, and even for post-conversion periods, such as $P_{17}$.

At the end of the binary-to-BCD operation of FIG. 8, the three characters 00, 04 and 73 of the converted BCD number 000473 are respectively contained in address locations FD, FE and FF. Note that, similar to that described in relation to FIG. 7, the write address for AQ RAM 59 is changed at the start of the next period following the storage of each of the characters of the BCD answer in RAM 59.

The converted BCD number contained in RAM 59 is 000473. However, because the most significant character is 00, it is ignored. Thus, the converted BCD number is 0473 which is the BCD equivalent of the input binary number 01D9 (or 0000 0001 1101 1001, which=111011001), as discussed before.

For other types of conversion operations, where the number of characters in the equivalent converted output number differs from the number of characters in the input number to be converted, the counter AQP 57 would be preset to a suitable address by suitable means (not shown) which would result in the CNV gate being long enough to develop all of the characters of the equivalent converted output number. Such preset means, while not shown, could be readily made a function of the "mode" signal and the number of characters in the input number (as shown by the address displacement of the counter CQW 34 from its FF home position).

The invention thus provides an apparatus which in the preferred embodiment uses the same signal flow and structure during a BCD-to-Binary conversion as it does during a binary-to-BCD conversion.

While the salient features of the invention have been illustrated and described, it should be readily apparent to those skilled in the art that many changes and modifications can be made in the apparatus of the invention presented without departing from the spirit and true scope of the invention. Accordingly, the present invention should be considered as encompassing all such changes and modifications of the invention that fall within the broad scope of the invention as defined by the appended claims.

What is claimed is:

1. Electrical apparatus for automatically converting an input number in a first form of either a BCD or binary number into an output number representing the input number and being in a second form of the remaining one of the BCD and binary number forms, each of said input and output numbers comprising at least one two-digit character, said apparatus comprising:
   input circuit means for selectively storing digits of the input number and subsequent interim digits and for selectively outputting each stored digit as an odd addend;
   first conversion circuit means responsive to each odd addend and to an associated odd multiplier for generating an even addend and a first lower digit together forming a character which is equal to the sum of the odd addend and the product of the odd multiplier and a preselected multiplicand;
   developing circuit means selectively responsive to the first lower digit for developing the odd multiplier;
   second conversion circuit means operating concurrently with said first conversion circuit means and responsive to each even addend and to an associated even multiplier for generating an interim digit and a second lower digit together forming a character which is equal to the sum of the even addend and the product of the even multiplier and the preselected multiplicand; and
   output circuit means responsive to associated first and second lower digits for selectively developing the even multiplier and the output number in its second form;
   each of said first and second conversion circuit means including a PROM having internal look up tables which are addressed by the combination of the associated input addend and input multiplier to develop an associated output character, said internal look up tables having a preselected multiplicand equal to ten for a BCD-to-binary conversion and equal to sixteen for a binary-to-BCD conversion.

2. The apparatus in accordance with claim 1 wherein said input circuit means comprises:
   a combining circuit for selectively combining each consecutive pair of interim digits into an interim character;
   an addressable storage circuit having predetermined storage locations being selectively responsive to the addressing of said storage locations for storing in predetermined storage locations each pair of associated digits of the input number as an input number character and each subsequent interim character and for selectively outputting characters in addressed storage locations; and
   a switching circuit for selectively developing a consecutive pair of odd addends from each character being outputted from said addressable storage circuit.

3. The apparatus in accordance with claim 1 wherein said developing means comprises:
   a gate for developing an odd multiplier equal to the first lower digit when said gate is enabled and an odd multiplier equal to zero when said gate is disabled.

4. The apparatus in accordance with claim 1 wherein said output circuit means comprises:
   an input register having lower and upper portions for respectively storing associated first and second lower digits temporarily;
   a gate for developing an even multiplier equal to the second lower digit when said gate is enabled and an even multiplier equal to zero when said gate is disabled; and
   an output storage circuit having predetermined storage locations being responsive to the addressing of said storage locations for selectively developing each character of the output number in its second form.

5. The apparatus in accordance with claim 3 or 4 wherein said input circuit means comprises:
   a combining circuit for selectively combining each consecutive pair of interim digits into an interim character;
   an addressable storage circuit having predetermined storage locations being selectively responsive to the addressing of said storage locations for storing in predetermined storage locations each pair of associated digits of the input number as an input number character and each subsequent interim character and for selectively outputting characters in addressed storage locations; and a switching circuit for selectively developing a consecutive pair of odd addends from each character being outputted from said addressable storage circuit.

6. The apparatus in accordance with claim 4 wherein said developing means comprises:

a gate for developing an odd multiplier equal to the first lower digit when said gate is enabled and an odd multiplier equal to zero when said gate is disabled.

7. The apparatus in accordance with claim 3 or 4 wherein:

said input circuit means comprises:

a combining circuit for selectively combining each consecutive pair of interim digits into an interim character;

an addressable storage circuit having predetermined storage locations being selectively responsive to the addressing of said storage locations for storing in predetermined storage locations each pair of associated digits of the input number as an input number character and each subsequent interim character and for selectively outputting characters in addressed storage locations; and a switching circuit for selectively developing a consecutive pair of odd addends from each character being outputted from said addressable storage circuit.

8. The apparatus in accordance with claim 7 wherein: said input circuit means comprises:

a combining circuit for selectively combining each consecutive pair of interim digits into an interim character;

an addressable storage circuit having predetermined storage locations being selectively responsive to the addressing of said storage locations for storing in predetermined storage locations each pair of associated digits of the input number as an input number character and each subsequent interim character and for selectively outputting characters in addressed storage locations; and a switching circuit for selectively developing a consecutive pair of odd addends from each character being outputted from said addressable storage circuit; and said developing means comprises:

a gate for developing an odd multiplier equal to the first lower digit when said gate is enabled and an odd multiplier equal to zero when said gate is disabled.

9. The apparatus in accordance with claim 4 wherein:

said input circuit means comprises:

a combining circuit for selectively combining each consecutive pair of interim digits into an interim character; and an addressable storage circuit having predetermined storage locations being selectively responsive to the addressing of said storage locations for storing in predetermined storage locations each pair of associated digits of the input number as an input number character and each subsequent interim character and for selectively outputting characters in addressed storage locations.

* * * * *

UNITED STATES PATENT AND TRADEMARK OFFICE
CERTIFICATE OF CORRECTION

PATENT NO. : 4,342,026
DATED : July 27, 1982
INVENTOR(S) : Lawrence G. Hanson

It is certified that error appears in the above-identified patent and that said Letters Patent are hereby corrected as shown below:

Col. 11, line 47, change "and", first occurrence, to --the--.

Col. 12, line 37, change "and", first occurrence, to --the--.

Col. 13, line 25, change "and", first occurrence, to --the--.

Signed and Sealed this

Twenty-first Day of September 1982

[SEAL]

Attest:

Attesting Officer

GERALD J. MOSSINGHOFF

Commissioner of Patents and Trademarks